(12) United States Patent
Marshall

(10) Patent No.: US 6,795,517 B1
(45) Date of Patent: Sep. 21, 2004

(54) LOW POWER PHASE LOCKED LOOP FREQUENCY SYNTHESIZER

(75) Inventor: Paul R. Marshall, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 676 days.

(21) Appl. No.: 09/663,674

(22) Filed: Sep. 18, 2000

(30) Foreign Application Priority Data

Sep. 25, 1999 (GB) .............................. 9922626

(51) Int. Cl.$^7$ .............................. H03D 3/24; H03L 7/00
(52) U.S. Cl. .......................... 375/376; 331/25; 331/14
(58) Field of Search ............................ 375/376, 374, 375/147; 327/147; 331/25, 14

(56) References Cited

U.S. PATENT DOCUMENTS

| | | | |
|---|---|---|---|
| 4,743,864 A | 5/1988 | Nakagawa et al. | 331/1 A |
| 5,410,572 A | 4/1995 | Yoshida | 375/376 |
| 5,475,877 A | 12/1995 | Adachi | 455/343 |
| 5,548,250 A * | 8/1996 | Fang | 331/14 |
| 5,594,735 A * | 1/1997 | Jokura | 370/337 |
| 5,598,405 A * | 1/1997 | Hirose | 370/280 |
| 6,173,025 B1 * | 1/2001 | Jokura | 375/376 |
| 6,280,327 B1 * | 8/2001 | Leifer et al. | 463/39 |
| 6,434,187 B1 * | 8/2002 | Beard et al. | 375/219 |

FOREIGN PATENT DOCUMENTS

| | | | |
|---|---|---|---|
| EP | 0565127 A2 | 10/1993 | H04Q/7/00 |
| GB | 2326992 A | 1/1999 | H03L/7/08 |

* cited by examiner

*Primary Examiner*—Stephen Chin
*Assistant Examiner*—Jason M. Perilla
(74) *Attorney, Agent, or Firm*—Aaron Waxler

(57) ABSTRACT

A phase locked loop frequency (PLL) synthesizer in which the scaled output of a reference oscillator(24) is compared with the scaled output of a voltage controlled oscillator (VCO)(10) in a comparator(22) to provide an error voltage which is integrated to form a frequency control voltage for the VCO. When the VCO has stabilized, the PLL is interrupted by the opening of a switch(32) in the output circuit of the comparator(22) and de-energizing the reference oscillator(24), scalers(18,26) and the comparator(22). A capacitor(36) which has been charged by the frequency control voltage maintains the output frequency of the VCO. Periodically the de-energized stages are re-energized and the switch(32) is closed to restore the PLL thereby enabling the VCO(10) to stabilize again after which the cycle of operations is repeated. A technique is disclosed for avoiding a jump in the VCO frequency when the switch(32) is closed.

8 Claims, 4 Drawing Sheets

Figure 1:
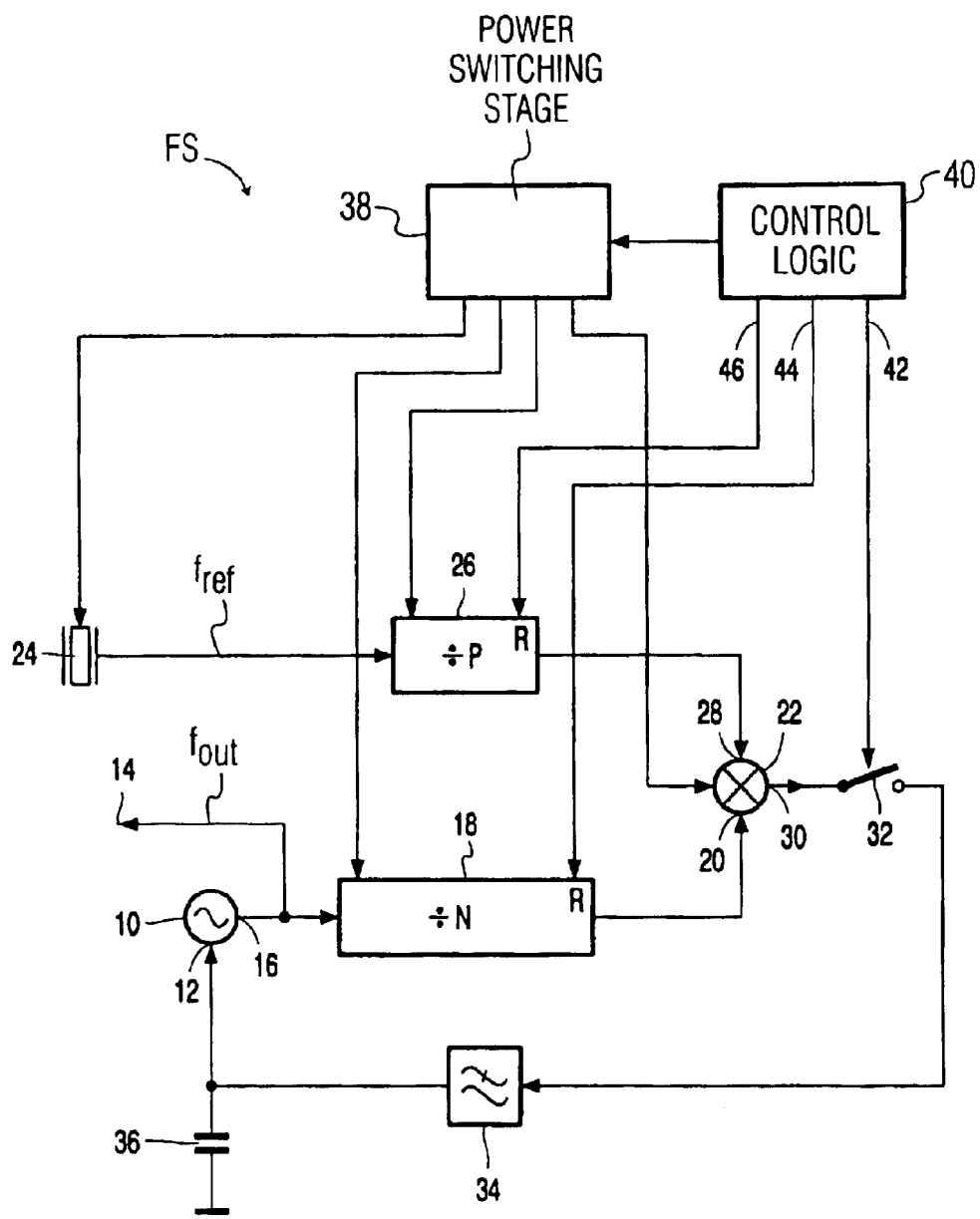

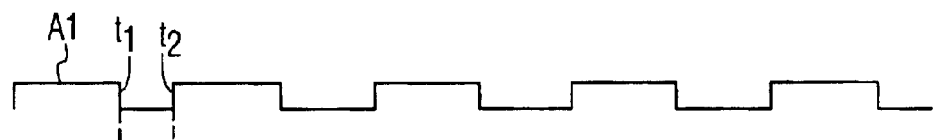
FIG. 2A
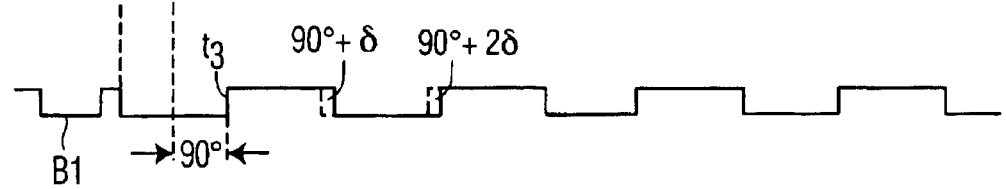
FIG. 2B
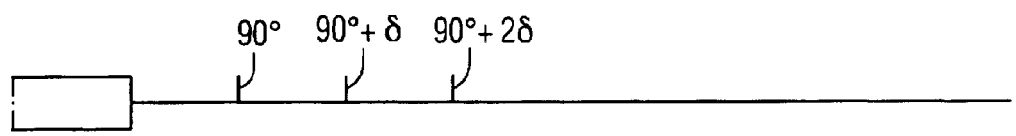
FIG. 2C
FIG. 2D

LOW POWER PHASE LOCKED LOOP FREQUENCY SYNTHESIZER

The present invention relates to a low power phase locked loop (PLL) frequency synthesiser and to devices including the low power PLL frequency synthesiser. Such devices may comprise telemetry modules, computer peripherals including set top boxes, wireless mouse and wireless joystick and integrated circuits therefor.

An operating requirement for such devices is that they have a very short time frame, for example, 13.5 ms in the case of video games and the on/off ratio can be such that the time between transmissions is less than the ramp-up period. Consequently it is difficult to apply current economy.

An object of the present invention is to effect current economy in a low power radio system without having any effect on its performance.

According to a first aspect of the present invention there is provided a method of operating a phase locked loop(PLL) frequency synthesiser in which a voltage controlled oscillator(VCO) generates an output frequency, comprising determining when the PLL has stabilised, interrupting the PLL and de-energising at least those components used for determining the value of the control voltage supplied to the VCO, applying a locally produced control voltage to the VCO, periodically restoring the power to said de-energised components and restoring the PLL, and repeating the cycle after the PLL has stabilised.

According to a second aspect of the present invention there is provided a phase locked loop(PLL) frequency synthesiser comprising a reference oscillator, a first frequency determining means coupled to an output of the reference oscillator, a voltage controlled oscillator(VCO) having a control input and an output, a second frequency determining means coupled to the output of the VCO, phase comparing means coupled to outputs of the first and second frequency determining means, integrating means coupling an output of the phase comparing means to the control input of the VCO, switching means in the circuit path from the phase comparing means to the integrating means, said switching means when conductive completing the PLL but when non-conductive interrupting the PLL, voltage storing means for applying a control voltage to the control input of the VCO when the PLL is interrupted, control means for providing control signals for switching-off the reference oscillator and the first and second frequency determining means and for rendering the switching means non-conductive to interrupt the PLL, the VCO producing an output signal in accordance with the voltage provided by the voltage storage means, and further control signals for switching-on the reference oscillator and the first and second frequency determining means, for resetting the first and second frequency determining means and for rendering the switching means conductive to restore the PLL.

The PLL frequency synthesiser made in accordance with the present invention is able to save current by allowing parts of the circuit to be intentionally switched-off without compromising the output frequency stability unduly because the control voltage to the VCO of the PLL is maintained substantially constant for a predetermined time.

U.S. Pat. No. 5,410,572 discloses a PLL frequency synthesiser circuit of generally conventional design which is applied to power control equipment. The circuit comprises a VCO generating an output frequency in response to a control voltage. The control voltage is determined by dividing down the output frequency in a frequency divider. The divided down frequency is compared with a reference frequency in a phase comparator. The output of the phase comparator is filtered to provide the control voltage for the VCO. In order to avoid the power control equipment being disabled due to loss of the reference frequency due to say a power cut, the reference signal is detected and if a loss is noted, the PLL is interrupted by a switch which connects a steady voltage to the control voltage input of the VCO. The steady voltage may comprise a battery or a capacitor which in normal operation has a charge corresponding to the current control voltage. This cited invention does not relate to a technique in which components of the PLL frequency synthesiser are switched off and on to maintain the output frequency constant whilst simultaneously saving current. Additionally the cited specification does not consider the effect of the decay of the charge on the capacitor which will pull the VCO frequency causing a frequency jump when the reference frequency is restored.

According to a third aspect of the present invention there is provided a transceiver comprising a receiving stage and a source of local oscillator signals coupled to the receiving stage, said source comprising a phase locked loop(PLL) frequency synthesiser comprising a reference oscillator, a first frequency determining means coupled to an output of the reference oscillator, a voltage controlled oscillator (VCO) having a control input and an output, a second frequency determining means coupled to the output of the VCO, phase comparing means coupled to outputs of the first and second frequency determining means, integrating means coupling an output of the phase comparing means to the control input of the VCO, switching means in the circuit path from the phase comparing means to the integrating means, said switching means when conductive completing the PLL but when non-conductive interrupting the PLL, voltage storage means for applying a control voltage to the control input of the VCO when the PLL is interrupted, control means for providing control signals for switching-off the reference oscillator and the first and second frequency determining means and for rendering the switching means non-conductive to interrupt the PLL, the VCO producing an output signal in accordance with the voltage provided by the voltage storage means, and further control signals for switching-on the reference oscillator and the first and second frequency determining means, for resetting the first and second frequency determining means and for rendering the switching means conductive to restore the PLL.

According to a fourth aspect of the present invention there is provided a wireless remote control device comprising a transceiver including a receiving stage and a source of local oscillator signals coupled to the receiving stage, said source comprising a phase locked loop(PLL) frequency synthesiser comprising a reference oscillator, a first frequency determining means coupled to an output of the reference oscillator, a voltage controlled oscillator(VCO) having a control input and an output, a second frequency determining means coupled to the output of the VCO, phase comparing means coupled to outputs of the first and second frequency determining means, integrating means coupling an output of the phase comparing means to the control input of the VCO, switching means in the circuit path from the phase comparing means to the integrating means, said switching means when conductive completing the PLL but when non-conductive interrupting the PLL, voltage storage means for applying a control voltage to the control input of the VCO when the PLL is interrupted, control means for providing control signals for switching-off the reference oscillator and the first and second frequency determining means and for rendering the switching means non-conductive to interrupt the PLL, the VCO producing an output signal in accordance with the voltage provided by the voltage storage means, and further control signals for switching-on the reference oscillator and the first and second frequency determining means, for resetting the first and second frequency determining means and for rendering the switching means conductive to restore the PLL.

The method of controlling the PLL frequency synthesiser enables the radio remote control device, for example computer peripherals including set-top boxes, a wireless mouse and a wireless joystick, to have the capability of continuous operation but the battery economy benefits of power cycling.

Figure 3:
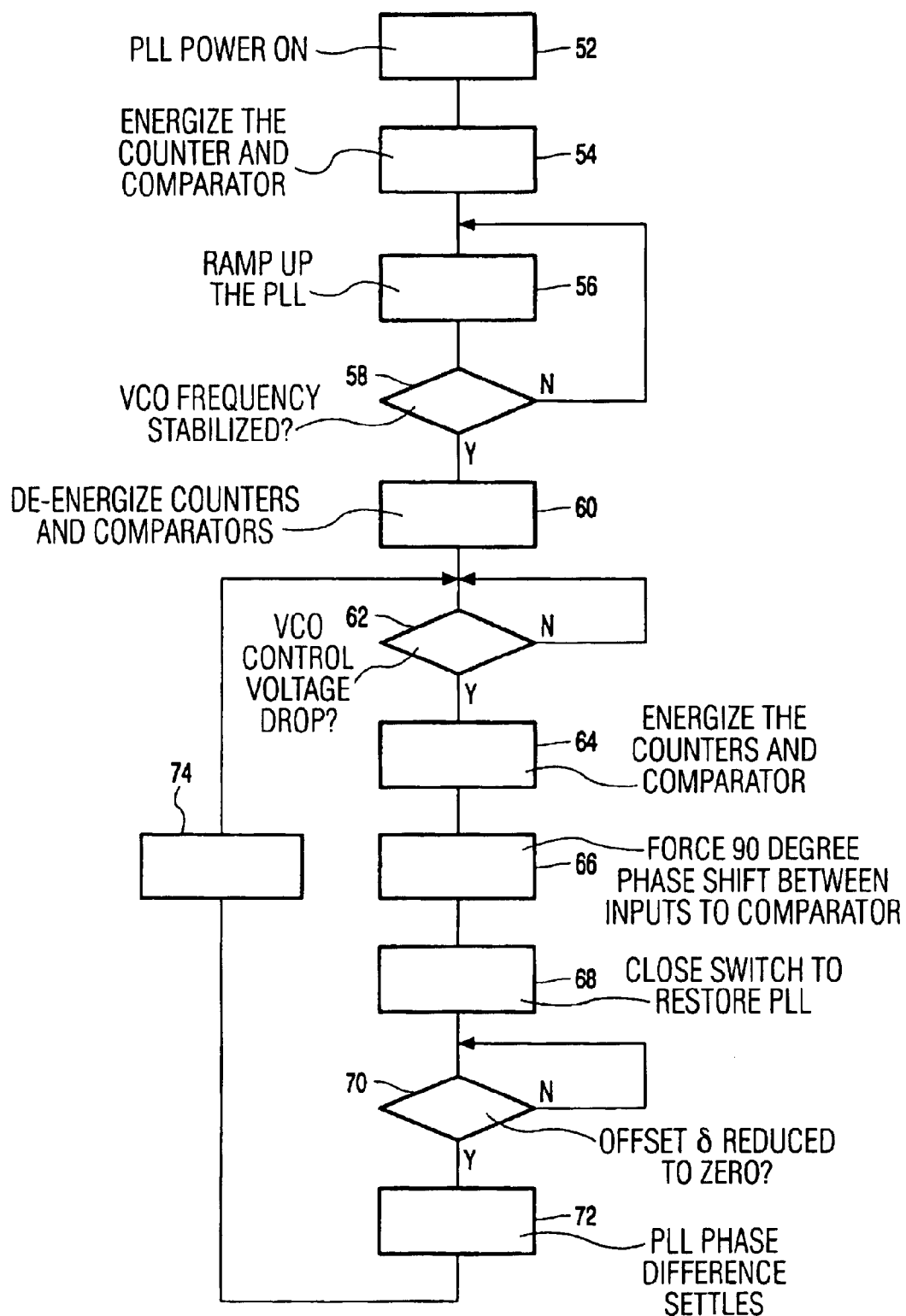
Figure 4:
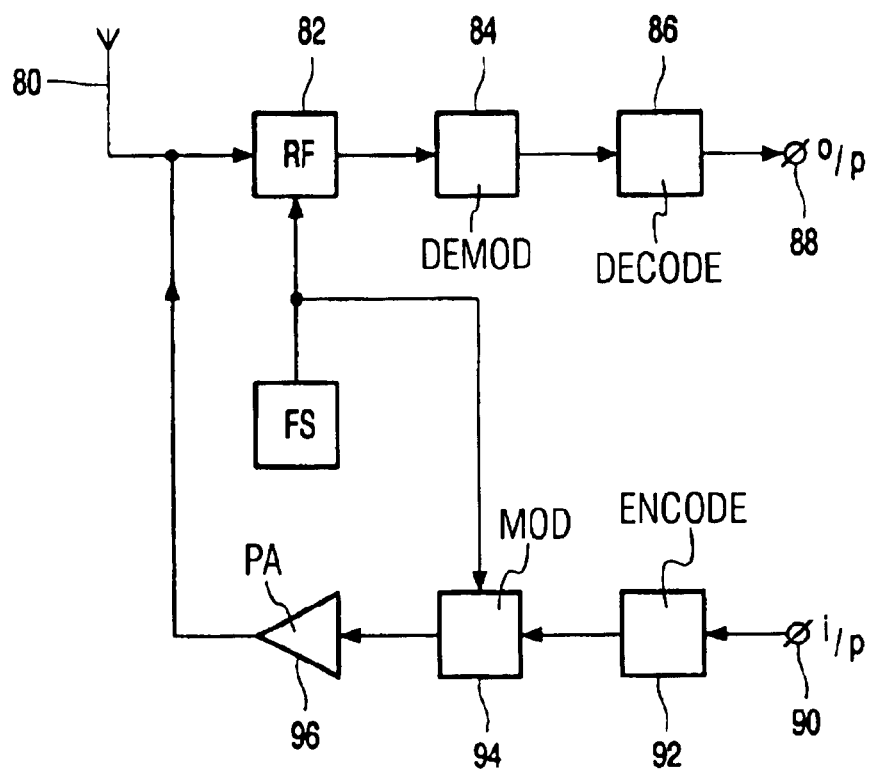

The present invention will now be described, by way of example, with reference to the accompanying drawings, wherein:

FIG. 1 is a block schematic diagram of one embodiment of a PLL frequency synthesiser made in accordance with the present invention, FIG. 2 comprises diagrams A to D which are used explaining how a jump in VCO frequency is avoided, FIG. 3 is a flow chart illustrating the sequence of operations associated with the operation of the embodiment shown in FIG. 1, and FIG. 4 is a block schematic diagram of a transceiver including the PLL frequency synthesiser made in accordance with the present invention.

In the drawings corresponding features have been indicated using the same reference numbers.

The PLL frequency synthesiser FS shown in FIG. 1 comprises a VCO 10 for generating an output frequency $f_{out}$ in response to a control voltage applied to a control input 12. The output frequency $f_{out}$ is derived from an output terminal 14 connected to the VCO output 16. A divide by N counter 18 is also connected to the VCO output 16 and its output is coupled to one input 20 of a comparator 22.

A crystal controlled reference oscillator 24 generating a reference frequency $f_{ref}$ has its output coupled to a divide by P counter 26, the output of which is coupled to a second input 28 of the comparator 22. An output 30 of the comparator 22 is coupled by way of a normally closed switch or switching device 32 to a low pass filter 34. The output of the low pass filter 34 provides the VCO control voltage to the control input 12. A voltage storage capacitor 36 which stores the output of the low pass filter 34 is coupled to the line connected to the input 12 of the VCO. Typically the capacitor 36 is included within the filter 34.

The basic operation of the PLL frequency synthesiser is well known. The output of the reference oscillator 24 is scaled by a factor of P in the counter 26 and the result is applied to the input 28 of the comparator 22. The output of the VCO 10 is scaled by a factor of N in the counter 18 and the result is applied to the input 20 of the comparator 22. The difference between the counts on the inputs 20, 28 appears on the output 30. The low pass filter 34 integrates this difference and produces a slowly varying voltage as the VCO control voltage, this voltage being stored on the capacitor 36.

In order to save power, a power switching stage 38 controls the current supply to the counters 18 and 26, the comparator 22 and the reference oscillator 24. A control logic stage 40 has an output 42 for actuating the switch (or switching means) 32 and outputs 44, 46 for resetting the counters 18 and 26.

In operation, at switch-on all the sections are powered-up and the switch 32 is closed. When the VCO 10 is operating at the correct frequency as determined by the ramp-up period, the control logic 40 opens the switch 32 interrupting the PLL and powers down the counters 18 and 26 and the reference oscillator 10. The VCO control voltage on the input 12 is maintained by the charge on the capacitor 36 which enables the VCO frequency $f_{out}$ to be maintained.

The VCO control voltage will begin to decay causing the output frequency $f_{out}$ to drift and after a period of time which is a system constant, the control logic 40 causes the counters 18 to 26 and the reference oscillator 10 to be re-energised and at the appropriate moment the switch 32 is closed.

The instant of closing the switch 32 is critical because if there is a phase error between the outputs of the counters 18 and 26, a change occurs in the VCO control voltage causing an undesirable jump in the VCO output frequency $f_{out}$. A large jump may occur even if the VCO frequency error is very small.

Referring to FIG. 2, diagram A shows the output of the counter 26 which also is the input 28 of the comparator 22, diagram B shows the output of the counter 18 which also is the input 20 of the comparator 22, diagram C is the phase error at the output 30 of the comparator 22 and diagram D is the variation in the output frequency $f_{out}$, at the output terminal 14.

In order to avoid a jump in the VCO frequency $f_{out}$, it is required that the phase difference between the inputs 20, 28 of the comparator be 90 degrees, thus avoiding a stop and giving a substantially, constant control voltage at the input 12 of the VCO 10. When the counters 18 and 26 and the reference oscillator 24 are re-energised, the phase relationship between the inputs 20, 28 of the comparator is unknown and could cause the jump in the VCO frequency. However if the counters 20, 28 are forced to have a phase difference of 90 degrees then a jump in VCO frequency is avoided.

Looking at diagrams A and B, the waveform portions A1 and B1 are uncoordinated. When the counter 26 overflows at $t_i$, this is used to zero or reset to a well defined point the count in the counter 18 and force the count in the counter 26 to be half its maximum value. Thus when the counters commence to count there will be a 90 degree phase difference between their leading edges referenced $t_2$, $t_3$. At this point in time the switch 32 is closed to restore the PLL.

Once the counters 18, 26 have resumed counting there will be a small offset δ to be corrected to the VCO frequency as a consequence of the drift in its frequency due to the decay of the voltage on the capacitor 36. The PLL loop corrects for this drift and in so doing the slight variation in the output frequency shown in Diagram D is compensated.

FIG. 3 is a flow chart illustrating the sequence of operations. Block 52 denotes switching on a device. Block 54 denotes the power switching stage 38 energising the counters 18, 26, the comparator 22 and the reference oscillator 24. Block 56 denotes the phase locked loop ramping-up to enable the VCO to generate $f_{out}$. The block 58 denotes determining whether the VCO frequency has stabilised which may be determined based on the time elapsed since the power switching stage 38 was activated. If the answer is no (N), the flow chart reverts to the block 56. However if the answer is yes (Y) then the synthesiser circuit enters a power saving mode by the block 60 denoting power being removed from the counters 18, 26, the comparator 22 and the reference oscillator 24 and the control logic opening the switch 32. Block 62 denotes checking whether a significant drop in the VCO control voltage from the capacitor 36 may have occurred. As mentioned this can be determined by measuring the time elapsed from power having been removed. If the answer is no(N), the flow chart reverts to the input of the block 62 but if the answer is yes (Y), the block 64 denotes restoring power to the counters 18, 26, the comparator 22 and the reference oscillator 24.

Block 66 denotes forcing the 90 degree phase shift between the inputs 20, 28 to the comparator 22, as described with reference to FIG. 2. Block 68 denotes the closing of the switch 32 to restore the PLL. Block 70 denotes checking if the offset δ has reduced to zero. If the answer is no (N), the flow chart reverts to the input of the block 70. A yes (Y) answer leads to the block 72 which denotes the PLL settling down to maintain a 90 degree phase difference whereby low pass filter 34 is not integrating up or down. Block 74 denotes the switch 32 being opened to break the PLL. The flow chart then proceeds to the block 62.

In non-illustrated refinements of circuit and flow chart, the PLL includes means for monitoring the magnitude of the correction required. Provision may then be made for checking if the power switching stage 38 restores power to the circuit too soon in which event when executing the next cycle of the flow chart the delay in restoring power, steps 62, 64, is increased.

FIG. 4 illustrates a transceiver which may be embodied in a variety of devices such as telemetry modules and computer peripherals such as a wireless remote control, a wireless mouse and a wireless joystick. The transceiver comprises an antenna 80 which is coupled to a receiver RF front end stage 82. The low power PLL frequency synthesiser FS, shown in greater detail, in FIG. 1 provides the local oscillator signals to the stage 82. A demodulator 84 demodulates the output from the RF stage 82 and supplies the demodulated signal to a decoder 86. An output terminal 88 is connected to an output of the decoder.

An input terminal 90 which may be coupled to a keypad or joystick (not shown) is coupled to an encoder 92. The encoded signal is suitably modulated on an RF frequency generated by the frequency synthesiser FS. A power amplifier 96 amplifies the modulated signal and supplies it to the antenna 80.

The low power PLL frequency synthesiser FS enables the RF stage 82 to remain active whilst saving current. This is important in certain applications such as computer games which require a response time of the order of 13 ms otherwise the game player senses a performance degradation.

In non-illustrated variants of the PLL frequency synthesiser shown in FIG. 1, the counter 26 is omitted and the reference frequency $f_{ref}$ is measured. When the phase of the reference frequency at the input 28 is at say zero degrees, the count in the counter 18 is forced to be 50% of its overflow value with the result that the desired phase shift is obtained at the output 30.

Conversely the counter 18 is omitted and the input 20 of the comparator is measured and at the appropriate phase angle, the count in the counter 26 is forced to get the correct phase at the input 28.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of PLL frequency synthesisers and component parts thereof and which may be used instead of or in addition to features already described herein.

What is claimed is:

1. A phase locked loop (PLL) frequency synthesiser comprising a reference oscillator, a first frequency determining means coupled to an output of the reference oscillator, a voltage controlled oscillator (VCO) having a control input and an output, a second frequency determining means coupled to the output of the VCO, phase comparing means coupled to outputs of the first and second frequency determining means, integrating means coupling an output of the phase comparing means to the control input of the VCO, switching means in the circuit path from the phase comparing means to the integrating means, said switching means when conductive completing the PLL but when non-conductive interrupting the PLL, voltage storing means for applying a control voltage to the control input of the VCO when the PLL is interrupted, control means for providing control signals for switching-off the reference oscillator, the phase comparing means, and the first and second frequency determining means and for rendering the switching means non-conductive to interrupt the PLL, the VCO producing an output signal in accordance with the voltage provided by the voltage storage means, and control signals for switching-on the reference oscillator and the first and second frequency determining means, and for providing control signals for forcing a 90 degree phase shift between the first and second frequency determining means and for rendering the switching means conductive to restore the PLL.

2. A frequency synthesiser as claimed in claim 1, characterised in that the first and second frequency determining means comprise first and second frequency scaling means, respectively.

3. A frequency synthesiser as claimed in claim 1, characterised in that the first frequency determining means comprises frequency scaling means and in that the second frequency determining means comprises frequency measuring means.

4. A frequency synthesiser as claimed in claim 1, characterised in that the first frequency determining means comprises frequency measuring means and the second frequency determining means comprises frequency scaling means.

5. A frequency synthesiser as claimed in claim 1, characterised in the means for applying the control voltage comprises means for storing a representation of the voltage applied to the control input prior to the interruption of the PLL.

6. A transceiver comprising a receiving stage and a source of local oscillator signals coupled to the receiving stage, said source comprising a phase locked loop (PLL) frequency synthesiser comprising a reference oscillator, a first frequency determining means coupled to an output of the reference oscillator, a voltage controlled oscillator (VCO) having a control input and an output, a second frequency determining means coupled to the output of the VCO, phase comparing means coupled to outputs of the first and second frequency determining means, integrating means coupling an output of the phase comparing means to the control input of the VCO, switching means in the circuit path from the phase comparing means to the integrating means, said switching means when conductive completing the PLL but when non-conductive interrupting the PLL, voltage storage means for applying a control voltage to the control input of the VCO when the PLL is interrupted, control means for providing control signals for switching-off the reference oscillator, the phase comparing means, and the first and second determining means and for rendering the switching means non-conductive to interrupt the PLL, the VCO producing an output signal in accordance with the voltage provided by the voltage storage means, and control signals for switching-on the reference oscillator and the first and second frequency determining means, and for providing control signals for forcing a 90 degree phase shift between the first and second frequency determining means and for rendering the switching means conductive to restore the PLL.

7. A transceiver as claimed in claim 6, characterised in that the first and second frequency determining means comprise first and second frequency scaling means, respectively.

8. A wireless remote control device comprising a transceiver including a receiving stage and a source of local oscillator signals coupled to the receiving stage, said source comprising a phase locked loop (PLL) frequency synthesiser comprising a reference oscillator, a first frequency determining means coupled to an output of the reference oscillator, a voltage controlled oscillator (VCO) having a control input and an output, a second frequency determining means coupled to the output of the VCO, phase comparing means coupled to outputs of the first and second frequency determining means, integrating means coupling an output of the phase comparing means to the control input of the VCO, switching means in the circuit path from the phase comparing means to the integrating means, said switching means when conductive completing the PLL but when non-conductive interrupting the PLL, voltage storage means for applying a control voltage to the control input of the VCO when the PLL is interrupted, control means for providing control signals for switching-off the reference oscillator, the phase comparing means, and the first and second frequency determining means and for rendering the switching means non-conductive to interrupt the PLL, the VCO producing an output signal in accordance with the voltage provided by the voltage storage means, and control signals for switching-on the reference oscillator and the first and second frequency determining means, and for providing control signals for forcing a 90 degree phase shift between the first and second frequency determining means and for rendering the switching means conductive to restore the PLL.

* * * * *